US009507277B2

(12) United States Patent
Aangenent et al.

(10) Patent No.: US 9,507,277 B2
(45) Date of Patent: Nov. 29, 2016

(54) LITHOGRAPHIC APPARATUS AND DEVICE MANUFACTURING METHOD

(75) Inventors: Wilhelmus Henricus Theodorus Maria Aangenent, 's-Hertogenbosch (NL); Johannes Petrus Martinus Bernardus Vermeulen, Helmond (NL); Ruud Antonius Catharina Maria Beerens, Roggel (NL); Rick Scholte, Eindhoven (NL); Ines Lopez Arteaga, Eindhoven (NL)

(73) Assignees: ASML NETHERLANDS B.V., Veldhoven (NL); SORAMA HOLDING B.V., Eindhoven (NL); TECHNISCHE UNIVERSITEIT EINDHOVEN, Eindhoven (NL)

( * ) Notice: Subject to any disclaimer, the term of this patent is extended or adjusted under 35 U.S.C. 154(b) by 820 days.

(21) Appl. No.: 13/811,894

(22) PCT Filed: Jul. 4, 2011

(86) PCT No.: PCT/EP2011/061206
§ 371 (c)(1),
(2), (4) Date: Jul. 18, 2013

(87) PCT Pub. No.: WO2012/013451
PCT Pub. Date: Feb. 2, 2012

(65) Prior Publication Data
US 2013/0335722 A1     Dec. 19, 2013

Related U.S. Application Data

(60) Provisional application No. 61/369,117, filed on Jul. 30, 2010.

(51) Int. Cl.
*G03F 7/20*     (2006.01)

(52) U.S. Cl.
CPC ........... *G03F 7/70775* (2013.01); *G03F 7/709* (2013.01); *G03F 7/70866* (2013.01)

(58) Field of Classification Search
CPC .......... G03F 7/70783; G03F 7/70758; G03F 7/7085; G03F 7/70775; G03F 7/70866; G03F 7/709
See application file for complete search history.

(56) References Cited

U.S. PATENT DOCUMENTS

| 4,175,441 A * | 11/1979 | Urbanek ................. G01S 15/32 367/114 |
| 2002/0060296 A1 * | 5/2002 | Van Der Veen .... G03F 7/70558 250/492.1 |
| 2003/0159517 A1 | 8/2003 | Ito |
| 2004/0252587 A1 | 12/2004 | Melese et al. |
| 2005/0139790 A1 * | 6/2005 | Boogaarts et al. ........... 250/548 |
| 2006/0250617 A1 * | 11/2006 | Donkelaar .......... G03F 7/70858 356/500 |
| 2006/0265889 A1 * | 11/2006 | Lof et al. ........................ 33/1 M |
| 2006/0285099 A1 * | 12/2006 | Sinke et al. .................... 355/55 |
| 2009/0174876 A1 * | 7/2009 | Schriever ............ G03F 7/70041 355/69 |
| 2009/0195763 A1 * | 8/2009 | Butler et al. ..................... 355/53 |
| 2011/0120222 A1 * | 5/2011 | Scholte et al. .................. 73/603 |
| 2013/0094678 A1 * | 4/2013 | Scholte ......................... 381/182 |

FOREIGN PATENT DOCUMENTS

| JP | 2007-225433 | 9/2007 |
| WO | 2009/130243 | 10/2009 |

OTHER PUBLICATIONS

Saijyou et al., Reduction methods of the reconstruction error for large-scale implementation of near-field acoustical holography, J. Acoust. Soc. Am. 110 (4), Oct. 2001.*
International Search Report mailed Nov. 14, 2011 in corresponding International Patent Application No. PCT/EP2011/061206.

* cited by examiner

*Primary Examiner* — Steven H Whitesell Gordon
(74) *Attorney, Agent, or Firm* — Pillsbury Winthrop Shaw Pittman LLP

(57) ABSTRACT

A lithographic apparatus includes a support constructed to support a patterning device, the patterning device being capable of imparting a radiation beam with a pattern in its cross-section to form a patterned radiation beam; a substrate table constructed to hold a substrate; a projection system configured to project the patterned radiation beam onto a target portion of the substrate; a sensor array positioned and arranged to detect an acoustic wave from a movable part of the lithographic apparatus, a controller, the controller having a controller input connected to the sensor array so as to receive a sensor array output signal, and a controller output connected to at least one actuator arranged to act on the movable part, the controller being arranged to: calculate a movement of the movable part from the sensor array output signal, and drive via the controller output the at least one actuator in response to the calculated movement.

18 Claims, 2 Drawing Sheets

LITHOGRAPHIC APPARATUS AND DEVICE MANUFACTURING METHOD

CROSS-REFERENCE TO RELATED APPLICATIONS

This application is the U.S. national phase entry of International Patent Application No. PCT/EP2011/061206, filed Jul. 4, 2011, which claims the benefit of priority from U.S. provisional application 61/369,117, which was filed on Jul. 30, 2010, and which is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Requirements of the lithographic apparatus in terms of throughput, resolution, etc. tend to be raised to higher and higher levels. However, the performance to be achieved is limited by the physical structure of chucks of the lithographic apparatus, such as the substrate (wafer) table or the support (such as the mask table). On the one hand, a stiff structure is desired so as to prevent an occurrence of resonance modes in the stage (which may limit a bandwidth), thereby allowing to achieve a high accuracy of positioning, while on the other hand a lightweight structure would be desired in order to allow fast acceleration of the stage, thereby allowing to achieve, for example, a high scanning speed and throughput.

SUMMARY

It is desirable to provide an improved lithographic apparatus.

According to an embodiment of the invention, there is provided a lithographic apparatus including: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, the lithographic apparatus further including: a sensor array positioned and arranged to detect an acoustic wave from a movable part of the lithographic apparatus, a controller, the controller having a controller input connected to the sensor array so as to receive a sensor array output signal, and a controller output connected to at least one actuator arranged to act on the movable part, the control system being arranged to: calculate a movement of the movable part from the sensor array output signal, and drive via the controller output the at least one actuator in response to the calculated movement.

According to an embodiment of the invention, there is provided a device manufacturing method including patterning using a patterning device a radiation beam to form a patterned radiation beam, the patterning device held by a patterning device support; projecting the patterned radiation beam onto a substrate, the substrate held by a substrate support; detecting an acoustic wave from one of the supports using a sensor array; and controlling an actuator arranged to act on the one support, the controlling including calculating a movement of the one support from the sensor array, and driving the actuator in response to the calculated movement.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
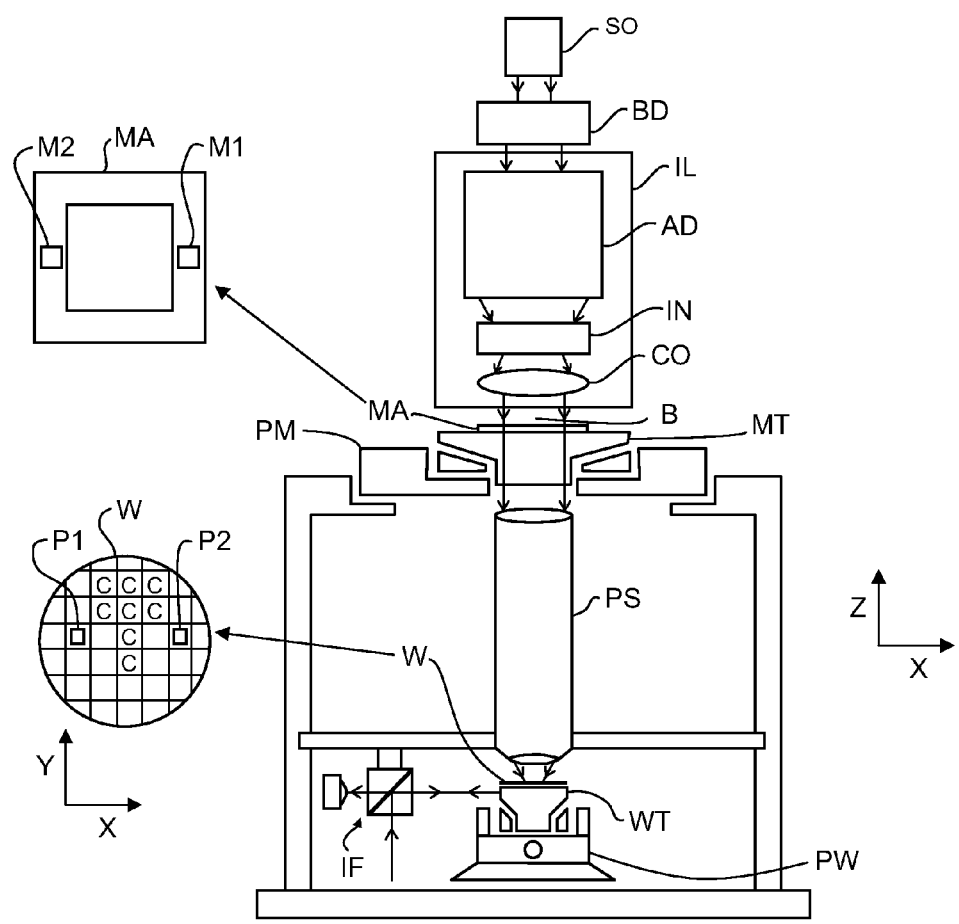
FIG. 1 depicts a lithographic apparatus according to in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described above, in order to meet ever more demanding requirements, on the one hand, a stiff structure of the chuck (or any other movable part of the lithographic apparatus) is desired so as to prevent an occurrence of resonance modes in the stage (which may limit a bandwidth), thereby allowing to achieve a high accuracy of positioning, while on the other hand a lightweight structure of the chuck would be desired in order to allow fast acceleration of the stage, thereby allowing to achieve a high scanning speed, throughput, etc, however, preferably not at a cost of positioning accuracy, due to for instance more powerful actuation having at comparable signal to noise ratios.

In order to cope with such at least partially conflicting requirements, it has been described to provide an overdetermined number of interferometers and/or encoders to measure a position of the stage, to derive a deformation and/or resonant mode information from the measurement results, and to provide one or more actuators in order to at least partially counteract such deformation. This solution however appeared to be potentially prone to some drawbacks. Firstly, in order to be able to achieve a sufficiently high accuracy of measurement with the over-determined number of sensors, a relatively large number of (costly) encoders and/or sensors would be required. Secondly, such encoders and/or interferometers would normally only allow to perform a position measurement for an outside part (edge, border, etc) of the stage in question, thereby providing limited information as to possible resonance modes, etc.

Furthermore, the chuck may be moved during e.g. a scanning movement of the lithographic apparatus. A substrate or patterning device may be provided on the chuck. During the scanning movement, a part of the wafer or patterning device is irradiated by the beam of illumination. The scanning character however may provide that the part of the wafer or patterning device that is irradiated, changes, which may result in a changing part at which a correct positioning is aimed, which may result in a position dependent relation between the measurements by the encoders and/or interferometers, and the irradiated portion that is to be positioned accurately.

The inventors have devised that one or more of the above items may be at least partly taken away by a lithographic apparatus in accordance with an embodiment of the invention, as will be described below with reference to FIG. 2.

Figure 2:
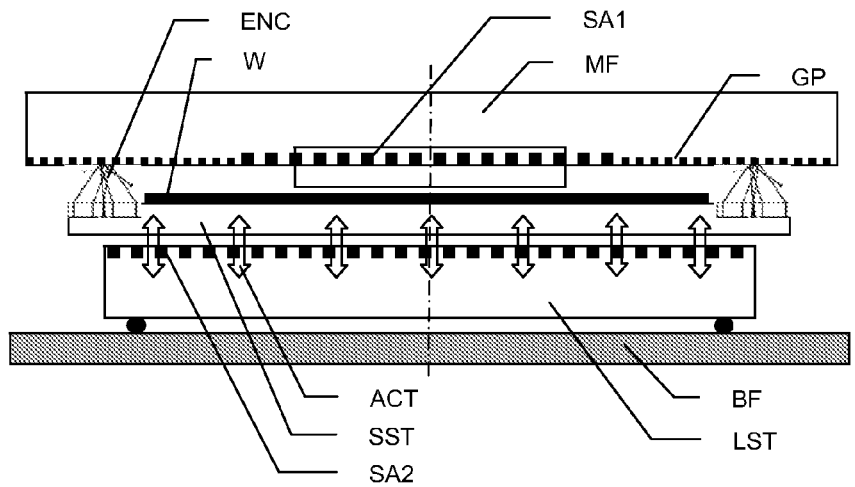
FIG. 2 depicts a schematic side view of a part of a lithographic apparatus in accordance with an embodiment of the invention.

FIG. 2 depicts a schematic side view of a substrate table WT which holds a substrate W, in this example a wafer. A metrology frame MF holds projection system PS (a part of which, in particular a downstream part of which being depicted in FIG. 2). The metrology frame is provided with a reference plate, such as a two dimensional (encoder) grid plate GP, which is in FIG. 2 schematically depicted by GP. A position of the substrate table WT in respect of grid plates GP and therefore in respect of the metrology frame MF is measured by encoders ENC. It will be appreciated that any other applicable type of position measure device may be used instead; e.g. an interferometric one (IF) such as depicted in FIG. 1. The substrate table WT is moved by a positioning device PW such as in this example a combination of a short stroke stage SST and long stroke stage LST. A sensor array is provided which includes acoustical sensor elements (e.g. microphones) so as to detect an acoustic wave from the chuck, in this example the substrate table. The sensor array may be provided on either or both sides of the substrate table. In this embodiment, a first sensor array SA1 is provided on or associated with the metrology frame, thereby being able to detect an acoustic wave from an upper (substrate) side of the substrate table. A second sensor array SA2 is provided below the substrate table, in this example on the long stroke stage LST, thereby being able to detect an acoustic wave from a bottom side of the substrate table. A control system or controller is provided, as will be further explained with reference to FIG. 3, which is arranged to calculate a movement of the stage from a sensor array output signal of the sensor array. Thereby, use may be made of a technique referred to as "acoustic Holography". The movement of the stage may comprise a rigid body translation or a rigid body rotation. The movement may comprise deformation of the stage caused by flexing, bending, torsion, expansion or contraction. The movement may be a combination of these types of movements. Resonances and/or other vibrations of the chuck, in this example the substrate table, may result in an acoustical wave emitted by it. The acoustical wave is received by the sensor array. A pattern and frequency of the acoustical wave will exhibit a correlation with the frequency, spatial frequency and resonance or other vibration patterns of the chuck. Hence, a vibration behavior (incl. resonances) may be determined by the controller from the received acoustical wave. An output signal of the controller may now be applied to drive one or more actuators. Thereto, in this example a plurality of actuators are provided to act on the substrate table. In FIG. 2, the actuators are highly schematically indicated using the arrows ACT. In an example, 10 or 20 actuators are provided, distributed over a surface of the substrate table. Each actuator may for example include a Lorentz actuator, a piezoelectric actuator, or any other suitable type of actuator. In accordance with an embodiment of the invention, the actuators are driven in response to the movement as calculated by the controller. Hence, the measurement of the movement of the substrate table using encoders (e.g. three encoders each providing a two dimensional position measurement so as to obtain a 6 Degrees of freedom position measurement of the substrate table) would not require any substantial changes, while a relatively low cost, yet high resolution and high frequency range measurement of resonances and vibrations of the chuck is provided by the additional measurement by the sensor array.

Figure 3:
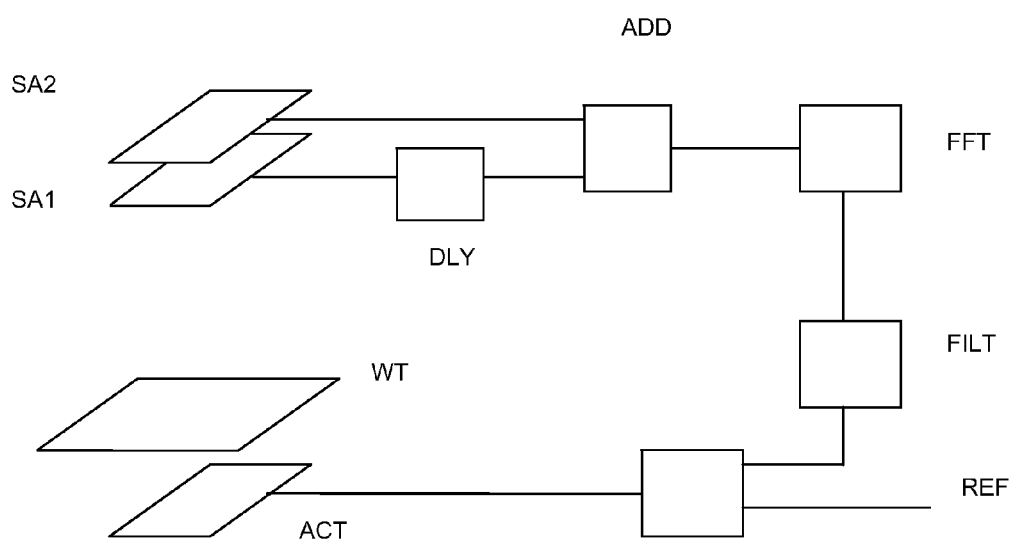
FIG. 3 depicts a block schematic view to illustrate an operation of an embodiment of a control system of the lithographic apparatus in accordance with FIG. 2.

FIG. 3 depicts a block schematic view of an embodiment of the controller CS. Sensor signals from a first sensor array SA1 are provided to an input of the controller CS. Similarly, sensor signals from a second sensor array SA2 are provided to a second input of the controller CS. As will be explained in more detail below, the signals from the sensor arrays SA1, SA2 are processed and the actuator or actuators (schematically referred to in FIG. 3 by ACT and described above in some more detail with reference to FIG. 2) are driven in response thereto. The actuator acts on the substrate table WT, thereby enabling the controller CS to at least partly compensate for an effect of vibrations, resonances, etc., as measured by the sensor arrays SA1, SA2. In this embodiment, two sensor arrays are provided, the sensor arrays are positioned with a mutual distance in the direction of travelling of the acoustic wave. Hence, an acoustic wave from the substrate table is first received by the sensor array SA1, and after a delay determined by the travelling time of the acoustic wave, the acoustic wave is received by the sensor array SA2. The sensor arrays thereby receive substantially a same acoustic wave. An output signal of the first one of the sensor arrays is delayed by delay unit DLY. Then, the output signal of the second sensor array and the delayed output signal of the sensor array are combined, e.g. added to each other by adder ADD (other means of combination are imaginable too, e.g. using correlation). Thereby, the acoustic wave to be detected may be better discriminated from disturbances such as other noises, stage motion, etc. In other embodiments, the first or second sensor array, delay, and adder may be omitted. The obtained signal may then subjected to a transformation to a frequency domain, such as a Fast Fourier Transformation. Again, the acoustic wave may now be discriminated from disturbances, as the acoustic wave, due to the eigenfreqencies and resonance modes of the substrate table, is expected in a certain frequency band, while other acoustical effects (such as stage scanning movement, etc) may be found in other, e.g. lower frequency bands. Therefore, a filtering may be applied by filter FILT. A comparison may be made with a reference REF which may represent a non resonating, stiff chuck. An outcome of the comparison may be used to drive the actuators. Further processing of the data may be performed (not depicted in FIG. 3), e.g. a conversion of the acoustical data into velocity information, and a conversion of the velocity information into position information.

An embodiment of filtering is described below. Reference is made to international patent application WO2009/130243, wherein processing techniques including FFT, filtering and inverse FFT have been described: a Fourier transform is performed on measured sound pressures, resulting in a sound pressure as a function of frequency in a spatial aperture. The truncated aperture may be expanded (for instance by linear border padding) so as to reduce leakage and spatial truncation errors. Then, a 2 dimensional Fourier transform is applied to the extrapolated spatial sound pressure so as to project the sound pressure as wave frequencies (or wave numbers) in a spatial frequency domain, i.e. a wave number domain. The sound pressure in the wave number domain is then extrapolated from a microphone array plane to the substrate table plane (or in general: the source plane). Then, a wave number domain regularization is applied so as to reduce errors due to noise during inverse mapping. Next, an inverse two dimensional Fourier transform is applied and a spatial truncation is applied.

The inventors have now devised that a further improvement to the above processing may be obtained by making use of the fact that the dynamic behavior of the substrate stage (and possibly of the microphone array) is known. The dynamical behavior may be determined by using finite element analysis or modal analysis. This allows to discriminate measured acoustic vibrations originating from the stage, from measured acoustic vibrations originating from other sources, such as the microphone array, or other parts. Referring to the above, the processing according to this embodiment starts with the same or similar steps as described above, namely:

a Fourier transform is performed on measured sound pressures, resulting in a sound pressure as a function of frequency in a spatial aperture. The truncated aperture may be expanded (for instance by linear border padding) so as to reduce leakage and spatial truncation errors. Then, a 2 dimensional Fourier transform is applied to the extrapolated spatial sound pressure so as to project the sound pressure as wave frequencies (or wave numbers) in a spatial frequency domain, i.e. a wave number domain. The sound pressure in the wave number domain (i.e. in the spatial frequency domain) is then extrapolated from a microphone array plane to the substrate table plane (or in general: the source plane). A spatial frequency transformer may be applied to extract information, such as an energy contained in one of the considered modes from the spatial frequency domain representation. Furthermore, the known dynamical behavior of the substrate stage, microphone etc. allows to:

compensate for environmental disturbances by taking into account in the spatial frequency domain the known dynamical behavior of at least one part of the lithographic apparatus, and/or differentiate between vibrations of a measurement surface (i.e. in this example the microphone array) and vibrations induced by the object under consideration, i.e. in this example the substrate stage.

In an embodiment, the measurement surface (i.e. the microphone array) may be disposed in contact with the object under consideration (e.g. the short stroke stage SST in FIG. 2 or the substrate table WT in FIG. 3), e.g. at the top and/or bottom of the considered object. This may provide that a delay due to the combination of distance and speed of sound may be omitted. As an example, in FIG. 2 a further sensor array may be provided top and/or bottom side of the short stroke stage SST.

The calculations in the spatial frequency domain may be performed relatively easily, thereby allowing to perform such calculations relatively fast. For example, a known dynamic behavior of a part of the lithographic apparatus translates in the spatial frequency domain into a region where wavenumbers of vibrations of such part are to be expected. Also, when making use of a layered structure of 2 microphone arrays, the spatial frequency domain representation allows to relatively easy combine the information from the two microphone arrays. The representation in the spatial frequency domain, e.g. obtained as a result of one or more of the above described operations in the spatial frequency domain, may now be applied to reconstruct a sound pressure image of the considered object, i.e. in this example the substrate stage. By the above processing in the spatial frequency domain, information about the vibrations or movement of the object (such as the substrate stage) may be obtained with relatively easy calculation steps, hence allowing to perform the calculations relatively fast so as to enable them to be used in real time applications.

The above described determining of the vibration/flexing/movement of the chuck may be summarized:

determining a wave frequency representation from the sensor output signal;

filtering the wave frequency representation;

determining a sound pressure image and/or particle velocity image of the chuck from the filtered wave frequency representation; and determining the movement of the chuck from the sound pressure image and/or particle velocity image.

The filtering of the wave frequency representation may include:

compensating for environmental disturbances by taking into account in the spatial frequency domain a known dynamical behaviour of at least one part of the lithographic apparatus, and/or differentiating between vibrations of the sensor array and vibrations induced by the chuck by taking into account in the spatial frequency domain a known dynamical behaviour of the sensor array.

Acoustic holography may be understood as a method where acoustic measurements of sound radiation are used to determine the location of the source (i.e. point of radiation) through an inverse solution of the acoustic wave equation. Via Fast Fourier Transformation of the measured data from a sound camera or an array of microphones, the frequency content and a spatial image of speed and intensity information (hologram) can be determined.

So far, acoustic holography is used, among others, as a non-contact modal analysis technique to reconstruct the occurring vibrations, i.e. the modal contributions of the occurring flexible modes.

Here, it is proposed to use near-field acoustic holography in feedback control loops to actively control the underlying resonant modal contributions of the occurring flexible modes of structural components in lithography systems. Relevant performance characteristics that may be achieved may include:

Resolution: near-field acoustic holography is based on sound pressure or particle velocity measurements, and state-of-the-art equipment may be able to measure velocities with a resolution of about 1 µm/s. This means that the resolution of the vibration amplitude of the measurement may be frequency dependent according to $\hat{x}=\hat{x}(f)=\hat{v}/\omega=1\cdot 10^{-6}/(2\pi f)$, and may range from 16 nm at 10 Hz down to 0.16 nm at 1 kHz. These vibration amplitude numbers may fit requirements, especially for out-of-plane metrology in lithographic applications. By near-field acoustic holography, particle velocity may be calculated with a measured sound pressure hologram as input; when particle velocity is measured (by for example a microflown sensor) the sound pressure may calculated by near-field acoustic holography as well.

Delay: a typical distance between the microphone arrays and the stage to be measured may be in the order of a few 100 µm, which means that the measurement delay is below 1 µs. This delay may be far from limiting control loop performance (current target for I/O and calculation delay are in the order of 50 µs). Furthermore, state-of-the-art algorithms may be computationally cheap and may become cheaper over time, possibly enabling real-time processing and hence real-time vibration control in a very cost-effective manner.

Sensor interface and sensitivity for disturbances: The microphone arrays may not require a vibration-free mounting interface, as opposed to conventional distance measurement systems, such as optical encoders, interferometers and capacitive sensors. A benefit compared to conventional sensors, therefore may be that near-field acoustic holography (NAH) sensors can simply be mounted at the long stroke stage to measure short stroke vibrations accurately (see FIG. 2). Also, no strict requirements may apply for to the target surface in terms of mechanical electrical, magnetic, electro-magnetic-, electrostatic, or optical properties. Finally, by using smart algorithms, NAH may be unsensitive to sound radiation from other machine components.

One or more of the following effects may be achieved: near-field acoustic holography potentially allows for a very low-cost alternative for multiple conventional position or distance measurement sensors (optical encoders, interferometers and capacitive probes) to relatively easy incorporate all relevant modal contributions of the occurring flexible modes in the feedback loop for non-rigid body control.

Due to the physical measurement principle of velocity measurement, the sensor interface may not require vibration-free mounting, as opposed to conventional distance measurement systems, such as optical encoders, interferometers and capacitive sensors, enabling sensor mounting on the long stroke stage. Even changes in surface properties (height steps, gaps, reflective/refractive transitions) may be of no issue, hence relaxing design constraints for future stages.

Through an array of multiple sensors in MEMS technology and powerful algorithms implemented in FPGA, this technology may be stretched down to the nm level and sub-µs delay at very low cost.

By the application of two-layer stacks of microphone arrays, complex curved surfaces may be measured in near future as well (3D metrology).

Although the invention has been described above with reference to a substrate table, it will be understood that the invention may be applied to any other chuck such as the support to support the patterning device, the mask table, or any other movable part in the lithographic apparatus. Hence, the term chuck is to be understood so as to include any movable part of the lithographic apparatus, such as a substrate table, a mask table, etc.

Although the above describes an example where use is made of acoustic information, it will be understood that the processing performed in the spatial frequency domain as described above may also be applied to data obtained from other sensors, such as from optical sensors (e.g. encoders and/or interferometers).

Furthermore, it is remarked that instead of the Fourier transform applied in the above examples, other transforms may be applied, such as a short time Fourier transform or a wavelet transform, thereby providing time information in addition to the frequency information.

The control system may be implemented in a form of software instructions loaded in a memory of a processing device or processor, such as a microcontroller, microprocessor, distributed computing system etc. The software instruction to, when loaded into the processing device, enable the processing device to perform the stated functions. Alternatively, the control system, or parts thereof, may be implemented in suitable hardware.

The sensor array may be any suitable acoustic sensor array, such as a capacitive, piezo, inductive, or resistive microphone array. Depending on the number of resonance modes to be detected, the resolution (number of pixels) may be chosen: it will be understood by the skilled person that a detection of resonance modes at a high spatial frequency may required a high spatial resolution of the sensor array, hence a large number of sensor pixels.

The term flexing of the chuck is to be understood so as to include any kind of flexing, e.g. by vibrations, resonant modes, and is to be understood so as to include any kind of periodic (repetitive) flexing as well as any kind of transient flexing phenomena.

It is noted that the filtering may also be based on software based finite element analysis and/or modal analysis performed in advance. Frequency band analysis results may become machine constant values.

Another possibility is to use the measurement information derived from the acoustic measurement as a fault detection device. Components that are wearing, tearing, and/or are getting loose may probably be detected through specific changes in the radiated wave field.

The sensor array may be positioned and arranged to detect a wave pattern of the moveable part. As described above, the sensor array may be arranged to detect a wave pattern by detecting an acoustic wave.

In another embodiment the sensor array comprises an optical sensor. A source provides a beam of radiation. A first part of the beam of radiation is incident on an area of the moveable object. A second part of the beam of radiation is incident on a reference structure, such as a reference mirror. By interference of the two parts, fringes can be created characterizing the shape of the area. The fringes are directed onto an optical sensor. Similar to what is described above, the fringes can be processed using a fourier transformation to project the fringes as wave frequencies in a spatial frequency domain. The wave frequencies may be further processed as described above.

To create the fringes, an interferometer, such as a Zygo interferometer may be used in an embodiment. The fringes describe a continuous wave pattern of an area on the moveable part. This has the benefit that the beam of radiation incident on the optical sensor contains all surface information. In comparison, a known encoder-system uses position measurements at a discreet number of locations on the area to measure a wave pattern of the moveable part. The wave pattern is constructed by fitting a pattern through the measured position values. This requires that the locations are carefully chosen, to ensure that the most important waves can be measured.

Movements or deformations of the moveable object result in changes of the fringes. A controller may use a signal from the optical sensor to control a position dependent parameter of the moveable object.

In an embodiment there is provided a lithographic apparatus comprising a patterning device, a substrate table and a projection system. The patterning device is capable of forming a patterned radiation beam. The substrate table is constructed to hold a substrate. The projection system is configured to project the patterned radiation beam onto a target portion of the substrate. The lithographic apparatus further comprises a sensor array and a controller. The sensor array is positioned and arranged to detect an acoustic wave from a movable part of the lithographic apparatus, as is disclosed in the previous embodiments. The controller includes a controller input connected to the sensor array to receive a sensor array output signal. The controller output is connected to an actuator arranged to act on the movable part.

The controller is configured to calculate a movement of the movable part from the sensor array output signal, and drive via the controller output the actuator in response to the calculated movement.

The patterning device may be a mask which has a pattern, for example on its surface. The patterning device may be capable to impart an unpatterned radiation beam with a pattern in its cross-section to form the patterned radiation beam. Alternatively, the patterning device does not include a mask, but is a so-called maskless patterning device. A patterned beam may be created by providing a beam of radiation onto an array of mirrors. Depending on the desired pattern, the mirrors may be tilted such that only a part of the radiation beam is directed toward the substrate. Alternatively, the source that provides the beam of radiation is the patterning device. The source may comprise an array of small radiation emitting sources, such as LEDs. By controlling each of the small radiation sources, a patterned radiation beam can be created.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a patterning device being capable of forming a patterned radiation beam;
   a substrate table constructed to hold a substrate;
   a projection system configured to project the patterned radiation beam onto a target portion of the substrate;
   a sensor array positioned and arranged to detect an acoustic wave from a movable part of the lithographic apparatus; and
   a controller including a controller input connected to the sensor array to receive a sensor array output signal, and a controller output connected to an actuator arranged to act on the movable part, the controller configured to:
     calculate a movement of the movable part from the sensor array output signal, wherein the movement includes a vibration, or a resonance or a deformation or any combination thereof of the movable part, and
     drive via the controller output the actuator in response to the calculated movement,
   wherein the movable part comprises a chuck, and
   wherein the chuck comprises at least one of the substrate table and a support for holding the patterning device capable of imparting a radiation beam with a pattern in its cross-section to form the patterned radiation beam.

2. The lithographic apparatus of claim 1, wherein the sensor array is disposed on a metrology frame of the lithographic apparatus, the metrology frame configured to hold at least part of the projection system, the sensor array being disposed around the projection system.

3. The lithographic apparatus of claim 1, wherein the sensor array comprises a Micro-Electro-Mechanical Systems microphone array.

4. The lithographic apparatus of claim 1, wherein a plurality of actuators are provided, the actuators being divided over a surface of the movable part.

5. The lithographic apparatus of claim 1, wherein the sensor array is disposed in contact with the movable part.

6. A lithographic apparatus comprising:
   a patterning device being capable of forming a patterned radiation beam;
   a substrate table constructed to hold a substrate;
   a projection system configured to project the patterned radiation beam onto a target portion of the substrate;
   a sensor array positioned and arranged to detect an acoustic wave from a movable part of the lithographic apparatus; and
   a controller including a controller input connected to the sensor array to receive a sensor array output signal, and a controller output connected to an actuator arranged to act on the movable part, the controller configured to:
     calculate a movement of the movable part from the sensor array output signal, and
     drive via the controller output the actuator in response to the calculated movement, wherein the sensor array is disposed at least partly under the substrate table.

7. The lithographic apparatus of claim 6, wherein the sensor array is disposed on a long stroke actuator that is constructed to drive the substrate table.

8. A lithographic apparatus comprising:
   a patterning device being capable of forming a patterned radiation beam;
   a substrate table constructed to hold a substrate;
   a projection system configured to project the patterned radiation beam onto a target portion of the substrate;
   a sensor array positioned and arranged to detect an acoustic wave from a movable part of the lithographic apparatus; and
   a controller including a controller input connected to the sensor array to receive a sensor array output signal, and a controller output connected to an actuator arranged to act on the movable part, the controller configured to:
     calculate a movement of the movable part from the sensor array output signal, and
     drive via the controller output the actuator in response to the calculated movement, wherein calculating the movement of the movable part includes determining a transformation of the sensor output signal to a frequency domain, and performing a filtering in the frequency domain.

9. A lithographic apparatus comprising:
   a patterning device being capable of forming a patterned radiation beam;
   a substrate table constructed to hold a substrate;
   a projection system configured to project the patterned radiation beam onto a target portion of the substrate;
   a sensor array positioned and arranged to detect an acoustic wave from a movable part of the lithographic apparatus; and
   a controller including a controller input connected to the sensor array to receive a sensor array output signal, and a controller output connected to an actuator arranged to act on the movable part, the controller configured to:
     calculate a movement of the movable part from the sensor array output signal, and
     drive via the controller output the actuator in response to the calculated movement, wherein calculating the movement of the movable part includes:
   determining a wave frequency representation from the sensor output signal;
   filtering the wave frequency representation;
   determining a sound pressure image of the movable part from the filtered wave frequency representation; and
   determining the movement of the movable part from the sound pressure image.

10. The lithographic apparatus of claim 9, wherein filtering the wave frequency representation comprises:
    compensating for environmental disturbances by taking into account in the spatial frequency domain a known dynamical behaviour of at least one part of the lithographic apparatus, and/or
    differentiating between vibrations of the sensor array and vibrations induced by the movable part by taking into account in the spatial frequency domain a known dynamical behaviour of the sensor array.

11. The lithographic apparatus of claim 10, wherein the known dynamical behaviour is determined by finite element analysis and/or modal analysis.

12. A lithographic apparatus comprising:
    a patterning device being capable of forming a patterned radiation beam;
    a substrate table constructed to hold a substrate;

a projection system configured to project the patterned radiation beam onto a target portion of the substrate;

a sensor array positioned and arranged to detect an acoustic wave from a movable part of the lithographic apparatus; and a controller including a controller input connected to the sensor array to receive a sensor array output signal, and a controller output connected to an actuator arranged to act on the movable part, the controller configured to:

calculate a movement of the movable part from the sensor array output signal, and drive via the controller output the actuator in response to the calculated movement, wherein calculating the movement of the movable part comprises converting the sensor output signal into velocity information and converting the velocity information into displacement information.

13. A lithographic apparatus comprising:

a patterning device being capable of forming a patterned radiation beam;

a substrate table constructed to hold a substrate;

a projection system configured to project the patterned radiation beam onto a target portion of the substrate;

a sensor array positioned and arranged to detect an acoustic wave from a movable part of the lithographic apparatus;

a controller including a controller input connected to the sensor array to receive a sensor array output signal, and a controller output connected to an actuator arranged to act on the movable part, the controller configured to:

calculate a movement of the movable part from the sensor array output signal, wherein the movement includes a vibration, or a resonance or a deformation or any combination thereof of the movable part, and drive via the controller output the actuator in response to the calculated movement, and a second sensor array, the sensor array and the second sensor array being positioned with a mutual distance in a direction of travelling of the acoustic wave.

14. The lithographic apparatus of claim 13, wherein the calculating comprises delaying one of the sensor array output signals in respect of the other, and adding the sensor output signal and the delayed sensor output signal.

15. A device manufacturing method comprising:

using a patterning device to form a patterned radiation beam;

projecting the patterned radiation beam onto a substrate, the substrate held by a substrate support;

detecting an acoustic wave from one of the substrate support and a patterning device support for holding the patterning device using a sensor array; and controlling an actuator arranged to act on the one support, the controlling including calculating a movement of the one support based on an output signal from the sensor array, wherein the movement includes a vibration, or a resonance or a deformation or any combination thereof of the movable part, and driving the actuator in response to the calculated movement.

16. The method of claim 15, wherein calculating the movement of the one support includes determining a transformation of a sensor output signal to a frequency domain, and performing a filtering in the frequency domain.

17. The method of claim 15, wherein calculating the movement of the one support includes:

determining a wave frequency representation from a sensor output signal;

filtering the wave frequency representation;

determining a sound pressure image of the one support from the filtered wave frequency representation; and determining the movement of the one support from the sound pressure image.

18. The method of claim 17, wherein filtering the wave frequency representation comprises:

compensating for environmental disturbances by taking into account in the spatial frequency domain a known dynamical behaviour of at least one part of the lithographic apparatus, and/or differentiating between vibrations of the sensor array and vibrations induced by the one support by taking into account in the spatial frequency domain a known dynamical behaviour of the sensor array.

* * * * *